United States Patent [19]
Sakai et al.

[11] Patent Number: 5,698,871
[45] Date of Patent: Dec. 16, 1997

[54] HETEROJUNCTION BIPOLAR TRANSISTOR

[75] Inventors: Masayuki Sakai; Teruyuki Shimura, both of Itami, Japan

[73] Assignee: Mitsubishi Denki Kabushiki Kaisha, Tokyo, Japan

[21] Appl. No.: 542,945

[22] Filed: Oct. 13, 1995

[30] Foreign Application Priority Data

Oct. 17, 1994 [JP] Japan ................. 6-250633

[51] Int. Cl.⁶ ......................... H01L 31/0328
[52] U.S. Cl. ................. 257/197; 257/198; 257/592
[58] Field of Search ................... 257/197, 198, 257/592

[56] References Cited

U.S. PATENT DOCUMENTS

| | | | |
|---|---|---|---|
| 5,068,705 | 11/1991 | Tran | 257/197 |
| 5,117,271 | 5/1992 | Comfort et al. | 257/198 |
| 5,177,583 | 1/1993 | Endo et al. | 257/198 |
| 5,185,274 | 2/1993 | Chang et al. | 257/523 |
| 5,266,830 | 11/1993 | Sato | 257/197 |
| 5,289,031 | 2/1994 | Watanabe et al. | 257/913 |
| 5,414,273 | 5/1995 | Shimura et al. | 257/197 |
| 5,481,120 | 1/1996 | Mochizuki et al. | 257/197 |
| 5,506,427 | 4/1996 | Imai | 257/197 |

FOREIGN PATENT DOCUMENTS

| | | | |
|---|---|---|---|
| 0361759 | 4/1990 | European Pat. Off. | 257/197 |
| 0375965 | 7/1990 | European Pat. Off. | 257/198 |
| 0430086 | 6/1991 | European Pat. Off. | 257/197 |
| 1233770 | 9/1989 | Japan | 257/197 |
| 3108339 | 5/1991 | Japan. | |

Primary Examiner—Mark V. Prenty
Attorney, Agent, or Firm—Leydig, Voit & Mayer, Ltd.

[57] ABSTRACT

A heterojunction bipolar transistor includes a compound semiconductor substrate, a collector layer disposed on the compound semiconductor substrate, a base layer disposed on the collector layer, the base layer being a semiconductor having a band gap energy and including an internal base region and an external base region, and an emitter layer disposed on the base layer and being a semiconductor having a band gap energy larger than the band gap energy of the semiconductor of the base layer. The base layer is larger in area than the emitter layer by the external base region. The external base region is sandwiched by insulating films at the external base region. Therefore, without ion-implantation to make the resistance of the collector layer below the external base region higher, i.e., without increasing the base resistance, the base-collector capacitance is reduced, resulting in an HBT having an improved high frequency gain.

1 Claim, 6 Drawing Sheets

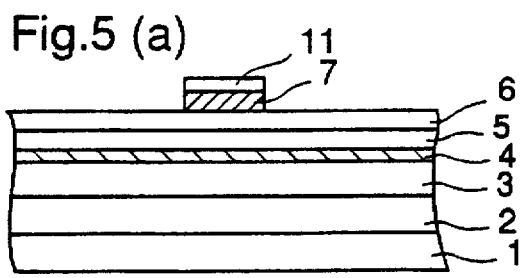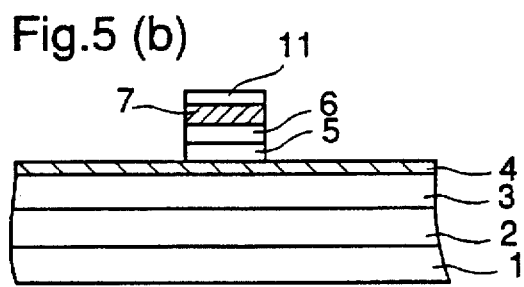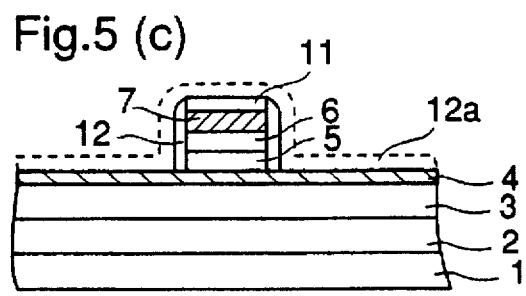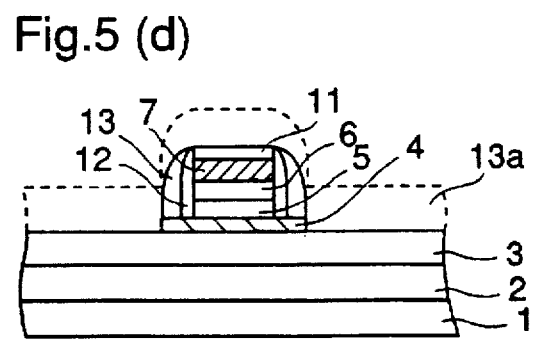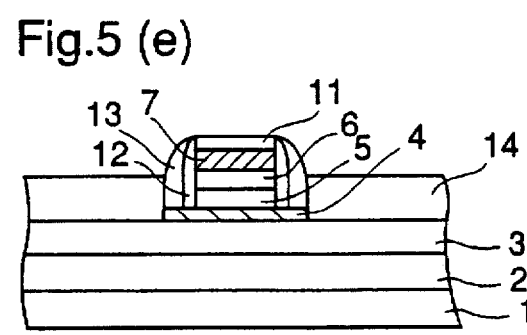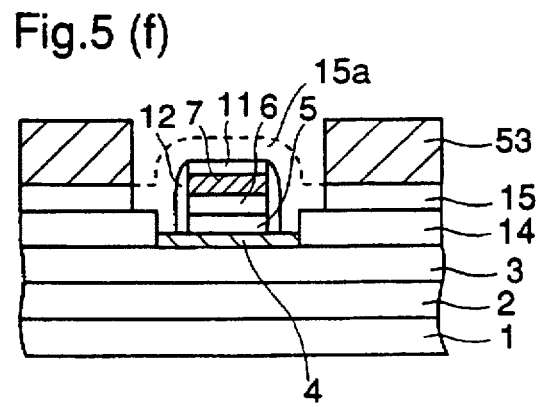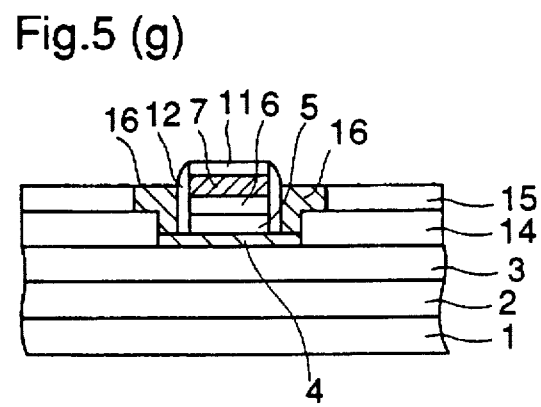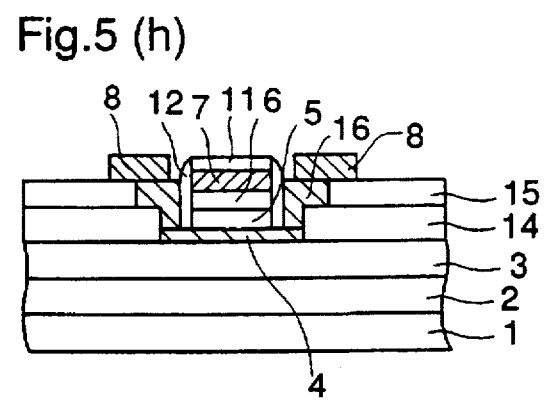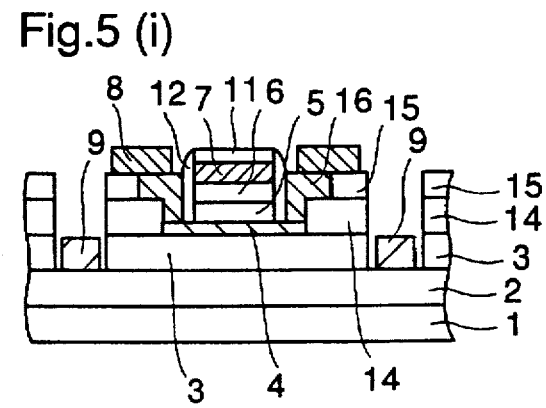

HETEROJUNCTION BIPOLAR TRANSISTOR

FIELD OF THE INVENTION

The present invention relates to a heterojunction bipolar transistor and a fabricating method thereof. More particularly, the invention relates to a heterojunction bipolar transistor having a reduced base-collector capacitance and a fabricating method thereof.

BACKGROUND OF THE INVENTION

Japanese Published Patent Application No. Sho 62-22665 discloses a prior art heterojunction bipolar transistor (hereinafter referred to as an HBT) having a structure with a reduced base-collector capacitance, as is shown in FIG. 7. In the figure, reference numeral 1 designates a semi-insulating GaAs substrate. An $n^+$ type GaAs collector contact layer 32 is disposed on the substrate 1. An n type GaAs collector layer 33 is disposed on a center region of the collector contact layer 32 and includes regions 41 into which oxygen ions are implanted at both ends. A p type GaAs base layer 34 is disposed on the collector layer 33. An n type AlGaAs emitter layer 35, an $n^+$ type GaAs emitter contact layer 36, and an emitter electrode 7 are successively disposed on a center region of the base layer 34. $SiO_2$ side walls 44 cover the side surfaces of these layers 35 and 36 and the electrode 7. Base electrodes 8 are disposed on regions of the base layer 34 other than the region on which the emitter layer 35 is disposed, and collector electrodes 9 are disposed on the collector contact layer 32 at both sides of the collector layer 33.

In the prior art HBT, regions of the collector layer 33 below external base regions where the base electrodes 8 are disposed, i.e., regions of the base layer 34 other than an intrinsic region just below the emitter layer 35, are made high resistance by implanting oxygen or hydrogen ions into those regions of the collector layer 33, whereby the base-collector capacitance is reduced.

In the above-described prior art method, however, since the ion-implantation is carried out through the external base regions, the resistance of the external base regions is increased, and the resistance of the ion-implanted regions in the collector layer 33 is decreased due to heat treatment, so that it is impossible to sufficiently reduce the base-collector capacitance. Further, since GaAs has a relatively large dielectric constant, 13.1, it has little effects on reduction in the capacitance. Furthermore, since the thickness of the ion-implanted high-resistance region is limited to about the thickness of the collector layer 33, there is a limit to the reduction in the capacitance.

SUMMARY OF THE INVENTION

It is an object of the present invention to provide an HBT with reduced base-collector capacitance without implanting ions to make portions of the collector layer below the external base regions high resistance, and a method of fabricating of the HBT.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, an HBT includes a collector layer disposed on a compound semiconductor substrate, a base layer disposed on the collector layer, and an emitter layer disposed on the base layer and comprising a semiconductor having a band gap energy larger than that of the semiconductor constituting the base layer. The base layer is larger than the emitter layer in area by an external base region, and the external base region is sandwiched by insulating films at the both side surfaces of the external base region. Therefore, without performing ion-implantation for making the resistance of the collector layer below the external base region higher, i.e., without increasing the base resistance, the base-collector capacitance is reduced, resulting in an HBT having an improved high frequency gain.

According to a second aspect of the present invention, a fabricating method of the above-described HBT includes successively forming a collector contact layer, a collector layer, and a base layer on a compound semiconductor substrate, forming an emitter layer on the base layer, forming an emitter electrode on a prescribed region of the emitter layer, selectively etching the emitter layer using the emitter electrode as a mask to form a ridge-shaped emitter structure comprising the emitter layer and the emitter electrode, forming a resist pattern so as to completely cover the emitter structure, selectively etching the base layer using the resist pattern as a mask, depositing an insulating film over the entire surface of the substrate and lifting off portions of the insulating film using the resist pattern to leave portions of the insulating film only on regions of the collector layer, the regions surrounding the base layer, forming base electrodes on opposite sides of the emitter structure, each contacting a region of the base layer and a region of the insulating film adjacent to each other, and forming collector electrodes on regions of the collector contact layer which are exposed by etching required regions of the collector layer. Therefore, without performing ion-implantation for making the resistance of the collector layer below the external base region higher, i.e., without increasing the base resistance, the base-collector capacitance is reduced, whereby an HBT having an improved high frequency gain is obtained.

According to a third aspect of the present invention, an HBT includes a collector layer disposed on a compound semiconductor substrate, a base layer disposed on the collector layer, and an emitter layer disposed on the base layer and comprising a semiconductor having a band gap energy larger than that of the semiconductor constituting the base layer. In the HBT, the base layer is larger than the emitter layer in area by an external base region, semi-insulating semiconductor layers are disposed outside the external base region so as to sandwich the base layer, regrown crystal layers comprising a semiconductor having the same conductivity type as the external base regions and doped with a dopant impurity to a high concentration are disposed on the external base regions and on the adjacent semi-insulating semiconductor layers, and base electrodes making an ohmic contact with the base layer through the regrown crystal layers are disposed on the regrown crystal layers. Therefore, without performing ion-implantation for making the resistance of the collector layer below the external base region higher, i.e., without increasing the base resistance, the base-collector capacitance is reduced, resulting in an HBT having an improved high frequency gain.

According to a fourth aspect of the present invention, a fabricating method of the above-described HBT includes successively forming a collector contact layer, a collector layer, and a base layer on a compound semiconductor substrate, forming an emitter layer on the base layer, forming an emitter electrode on a prescribed region of the emitter layer and a first insulating film on the emitter electrode to form a laminated structure comprising the emitter electrode and the first insulating film, selectively etching the emitter layer using the laminated structure as a mask, depositing a second insulating film comprising the same material as the first insulating film over the entire surface of the substrate, anisotropically etching the deposited second insulating film to form first side walls comprising the second insulating film, depositing a third insulating film which can be etched selectively with respect to the first and second insulating films over the substrate, anisotropically etching the third insulating film selectively with respect to the first and second insulating films to form second side walls covering the first side walls, selectively etching the base layer using the first and second side walls as masks to expose the collector layer, selectively growing a semi-insulating semiconductor layer on the exposed region of the collector layer, depositing a fourth insulating film comprising the same material as the third insulating film over the substrate and patterning the fourth insulating film to form a resist pattern having an aperture over the emitter layer and the external base region, selectively etching the fourth insulating film and the second side walls using the resist pattern as a mask, selectively growing a regrown crystal layer comprising a semiconductor having the same conductivity type as the base layer using the first insulating film, the first side walls, and the fourth insulating film as masks, forming base electrodes on the regrown crystal layer, and forming collector electrodes on regions of the collector contact layer which are exposed by etching required regions of the collector layer. Therefore, without performing ion-implantation for making the resistance of the collector layer below the external base region higher, i.e., without increasing the base resistance, the base-collector capacitance is reduced, whereby an HBT having an improved high frequency gain is obtained. In addition, the base layer and the regrown crystal layer are formed self-alignedly with the emitter layer and the emitter electrode, whereby uniformity and reproducibility of electric characteristics of an HBT are improved, resulting in good yield.

According to a fifth aspect of the present invention, an HBT includes a collector contact layer disposed on a compound semiconductor substrate, a collector layer disposed on the collector contact layer, an insulator body embedded in an annular groove which is formed by etching the collector layer, a base layer disposed on the collector layer and including an external base region comprising polycrystalline material on the embedded insulator body, and an emitter layer, an emitter contact layer, and an emitter electrode which are successively disposed on an intrinsic base region inside the external base region. Therefore, without performing ion-implantation for making the resistance of the collector layer below the external base region higher, i.e., without increasing the base resistance, the base-collector capacitance is reduced, resulting in an HBT having an improved high frequency gain.

According to a sixth aspect of the present invention, a fabricating method of the above-described HBT includes successively forming a collector contact layer and a collector layer on a compound semiconductor substrate, forming a resist pattern having an aperture over a required annular region of the collector layer, etching the annular region of the collector layer using the resist pattern as a mask, anisotropically depositing an insulating film over the entire surface of the substrate and lifting off portions of the insulating film using the resist pattern to leave a portion of the insulating film as an insulator body in the etched annular groove of the collector layer, successively growing a base layer, an emitter layer, and an emitter contact layer over the substrate so as to form a polycrystalline layer on the insulator body, forming an emitter electrode on a region of the emitter contact layer surrounded by the grown polycrystalline layer, selectively etching the emitter contact layer and the emitter layer using the emitter electrode as a mask to expose the base layer, forming base electrodes on the annular portion of the base layer, and forming collector electrodes on regions of the collector contact layer which are exposed by etching required regions of the collector layer. Therefore, without performing ion-implantation for making the resistance of the collector layer below the external base region higher, i.e., without increasing the base resistance, the base-collector capacitance is reduced, whereby an HBT having an improved high frequency gain is obtained.

BRIEF DESCRIPTION OF THE DRAWINGS

FIGS. 5(a)–5(i) are sectional views illustrating process steps in a method of fabricating the HBT shown in FIG. 2 in accordance with a fifth embodiment of the present invention.

DETAILED DESCRIPTION OF THE PREFERRED EMBODIMENT

Embodiment 1

A description is given of a first embodiment of the present invention.

Figure 1:
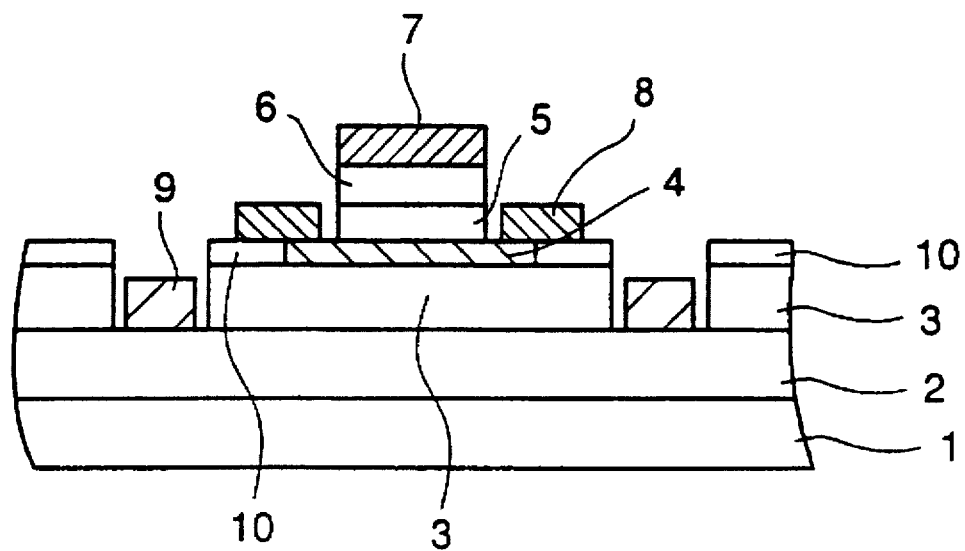
FIG. 1 is a sectional view of an HBT in accordance with a first embodiment of the present invention.

FIG. 1 is a sectional view of an HBT according to a first embodiment of the present invention. In the figure, reference numeral 1 designates a semi-insulating compound semiconductor substrate. A collector contact layer 2 doped with an n type dopant impurity to a high concentration, exceeding $3 \times 10^{18}$ cm$^{-3}$, is disposed on the compound semiconductor substrate 1. The collector contact layer is 5000 Å thick. A collector layer 3 having an n type dopant concentration of $1 \sim 5 \times 10^{16}$ cm$^{-3}$ and a thickness of 5000 Å is disposed on the collector contact layer 2. A base layer 4 doped with a p type dopant impurity to a high concentration, exceeding $1 \times 10^{19}$ cm$^{-3}$, is disposed on a center region of the collector layer 3. The base layer is 1000 Å thick. An emitter layer 5 having an n type dopant concentration of $0.3 \sim 1 \times 10^{18}$ cm$^{-3}$ and a larger band gap energy than that of the base layer 4 is disposed on the base layer. Preferably, the emitter layer 5 comprises n type $Al_xGa_{1-x}As$ (x: 0.3→0) having a thickness of 300 Å, n type $Al_{0.3}Ga_{0.7}As$ having a thickness of 900 Å, and n type $Al_xGa_{1-x}As$ (x: 0.3→0) having a thickness of 300 Å. A high concentration n type emitter contact layer 6 having an n type dopant concentration exceeding $2 \times 10^{19}$ cm$^{-3}$ and comprising, for example, InGaAs, is disposed on the emitter layer 5. Preferably, the n type emitter contact layer 6 comprises n⁺ type $In_{0.5}Ga_{0.5}As$ having a thickness of 500 Å and n⁺ type $In_yGa_{1-y}As$ (y: 0→0.5) having a thickness of 500 Å. An emitter electrode 7 comprising, for example, WSi, is disposed on the emitter contact layer 6. An insulating film 10 is disposed on a portion of the collector layer 3 where the base layer 4 is absent. Base electrodes 8 comprising Ti/Mo/Au are disposed on both sides of the emitter layer 5, contacting the base layer 4 and the insulating film 10. Collector electrodes 9 comprising AuGe are disposed on portions of the collector contact layer 2 where the collector layer 3 is absent.

In the HBT according to this first embodiment of the invention, the insulating film 10 is disposed below each base electrode 8, and the external base regions of the base layer 4 are located between the insulating films 10. Therefore, in order to reduce the base electrode resistance, the width of the base electrode 8 can be 1 μm or more. Further, since the width of the external base region can be smaller than the width of the base electrode 8, the base-collector capacitance can be reduced.

A high frequency pain G of an HBT is represented by $$G = \frac{f_T}{8\pi R_B C_{BC}} \cdot \frac{1}{f^2}$$

where $f_T$ is the transition frequency, $R_B$ is the base resistance which is equal to the total of the base electrode resistance, the contact resistance, and the base layer resistance, $C_{BC}$ is the base-collector capacitance, and f is the operation frequency. As described above, since $R_B$ and $C_{BC}$ are both reduced, the gain G can be improved.

Consequently, in the HBT according to the first embodiment of the invention, since the insulating film 10 is disposed below each base electrode 8 and the external base regions of the base layer 4 are located between the insulating films 10, in order to reduce the base electrode resistance, the width of the base electrode 8 can be 1 μm or more, and the base-collector capacitance can be reduced. That is, the base-collector capacitance is reduced without increasing the base resistance, resulting in an improvement in the high frequency gain.

Embodiment 2

Figure 2:
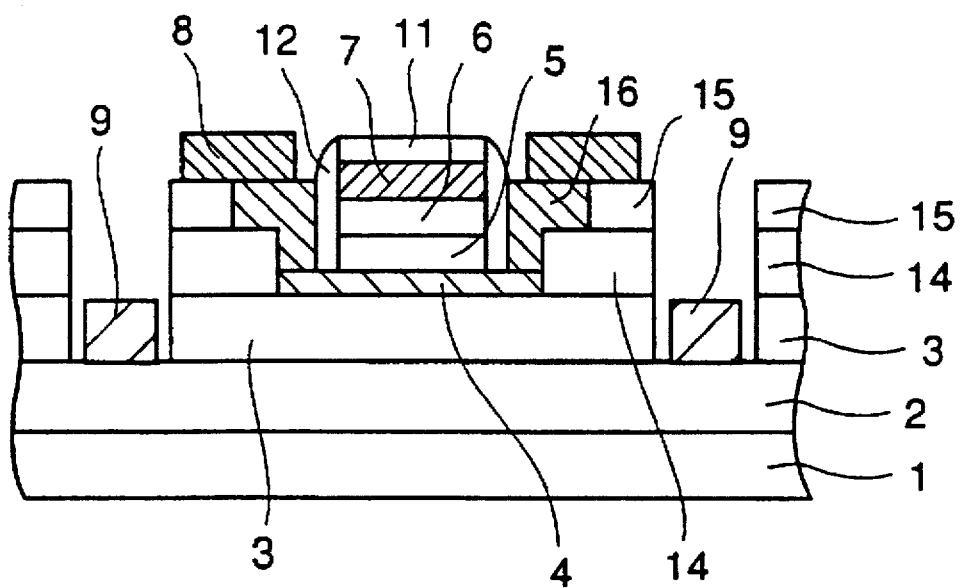
FIG. 2 is a sectional view of an HBT in accordance with a second embodiment of the present invention.

FIG. 2 is a sectional view of an HBT according to a second embodiment of the present invention. In the figure, the same reference numerals as in FIG. 1 designate the same or corresponding parts. A first insulating film 11 is disposed on the emitter electrode 7. First side walls 12 cover the side surfaces of the emitter layer 5, the high concentration n type emitter contact layer 6, and the emitter electrode 7. The side walls 12 comprise the same insulating material as the first insulating film 11. Semi-insulating semiconductor layers 14 are disposed on the collector layer 3, sandwiching the base layer 4 disposed on a center portion of the collector layer 3. Semiconductor layers (hereinafter referred to as regrown crystal layers) 16 are disposed on both ends of the base layer 4. The regrown crystal layers 16 are doped with a high concentration of a dopant impurity producing the same conductivity type as the base layer 4. A fourth insulating film 15 is disposed on each semiconductor layer 14. The insulating film 15 is used as a mask when the regrown crystal layers 16 are selectively grown.

In the HBT according to this second embodiment of the invention, the semi-insulating semiconductor layers 14 are disposed below the base electrodes 8, and the external base regions of the base layer 4 are located between the semi-insulating semiconductor layers 14. More specifically, the base layer 4 is disposed not over the entire surface of the collector layer but only on the center portion of the collector layer, whereby the base-collector capacitance $C_{BC}$ is reduced.

The regrown crystal layer 16 which connects the base electrode 8 to the base layer 4 can be doped with a dopant impurity to a high concentration of, for example, $\sim 1 \times 10^{20}$ cm⁻³, whereby resistance of the regrown crystal layer 16 is reduced. Further, the contact area of the base electrode 8 with the regrown crystal layer 16 can be made relatively large, for example, 1 μm or more, whereby the contact resistance between them is significantly reduced.

In this second embodiment of the invention, the semi-insulating semiconductor layers 14 are disposed outside the external base regions sandwiching the base layer 4, the regrown crystal layers 16 having the same conductivity type as the external base regions and doped with a dopant impurity to a high concentration are disposed on both the external base regions and the adjacent semi-insulating semiconductor layers 14, and the base electrodes 8 making an ohmic contact with the base layer are disposed on the regrown crystal layers 16. Therefore, the area of the base layer is reduced, and the regrowth crystal layer 16 outside the external base region and the base electrode 8 are separated from the collector layer 3 due to the existence of the semi-insulating semiconductor layer 14 and the fourth insulating film 15, whereby the base-collector capacitance $C_{BC}$ is reduced. In addition, since the regrown crystal layer 16 connecting the base electrode 8 to the base layer 4 can be doped with a dopant impurity to a high concentration, the resistance of the regrown crystal layer 16 is reduced. Further, since the contact area of the base electrode 8 with the regrown crystal layer 16 can be made relatively large, the contact resistance between them is significantly reduced, whereby the base resistance $R_B$ is reduced. Consequently, the base-collector capacitance is reduced without increasing the base resistance, resulting in an HBT having an improved high frequency gain.

Embodiment 3

Figure 3:
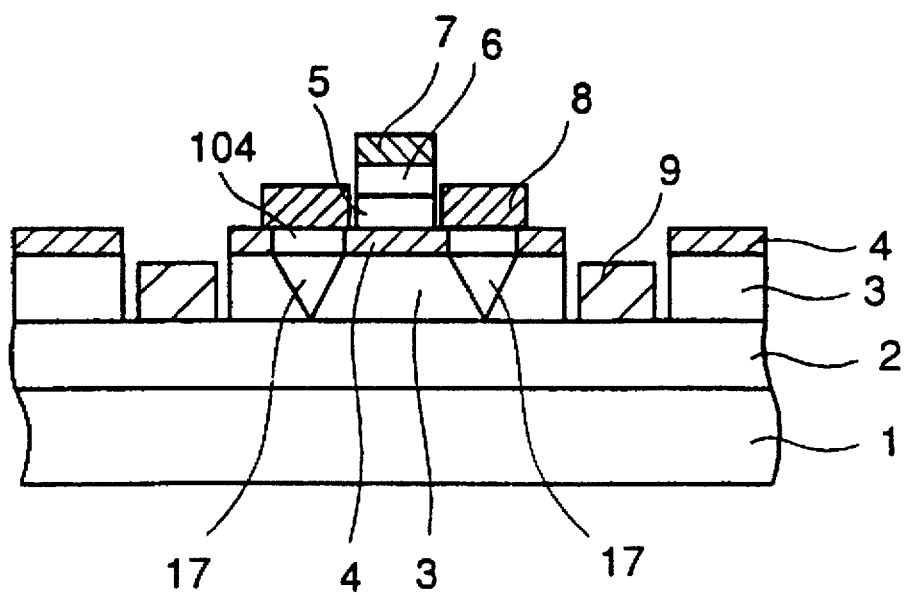
FIG. 3 is a sectional view of an HBT in accordance with a third embodiment of the present invention.

FIG. 3 is a sectional view of an HBT according to a third embodiment of the present invention. In the figure, the same reference numerals as in FIG. 1 designate the same or corresponding parts. An insulating film 17 is embedded in a region of the collector layer 3. The region is formed by etching and surrounds the internal base region of the base layer 4 below the emitter layer 5. A polycrystalline base layer 104 corresponding to the above-described external base region is disposed on the collector layer 3 opposite the insulating film 17. When the base layer 4 is regrown, the polycrystalline external base layer 104 is formed self-alignedly with the base layer 4 in the region surrounding the base layer 4. On the polycrystalline layer 104, the base electrode 8 is disposed, and the polycrystalline layer 104 connects the internal base region of the base layer 4 to the base electrode 8.

In the HBT according to this third embodiment of the invention, the insulating film 17 is embedded in a region of the collector layer 3 which is formed by etching and surrounds the internal base region, the polycrystalline layer 104 is disposed on the insulating film 17, and the base electrode 8 makes an ohmic contact with the base layer 4 through the polycrystalline layer 104. Since a region of the collector layer 3 comprising a material having a relatively large dielectric constant, such as GaAs (dielectric constant: 13.2), is removed and an insulating film having a relatively small dielectric constant, such as SiO or SiN (dielectric constant: 5~6), fills the removed portion, the base-collector capacitance is reduced and the high frequency gain is improved.

Consequently, even when the width of the base electrode exceeds a prescribed width in order to reduce the base electrode resistance, the base-collector capacitance $C_{BC}$ can be reduced, resulting in an HBT having an improved high frequency gain.

Embodiment 4

FIGS. 4(a)–4(i) are sectional views illustrating process steps in a method of fabricating the HBT described as the first embodiment, according to a fourth embodiment of the present invention.

A description is given of the fabricating method.

Figure 4:
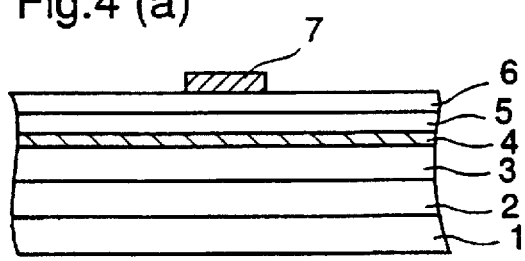
FIGS. 4(a)–4(i) are sectional views illustrating process steps in a method of fabricating the HBT shown in FIG. 1 in accordance with a fourth embodiment of the present invention.
Figure 4:
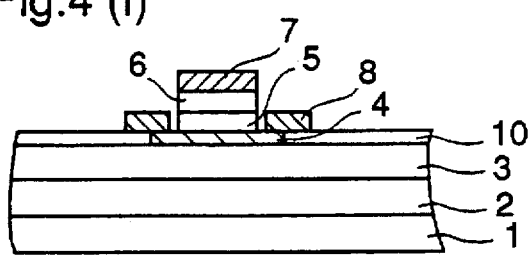
Figure 4:
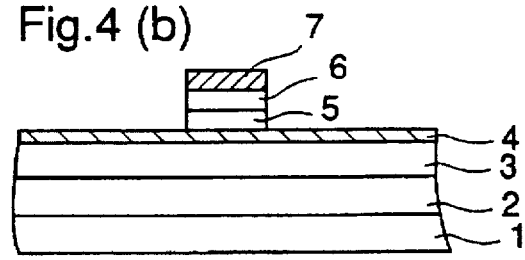
Figure 4:
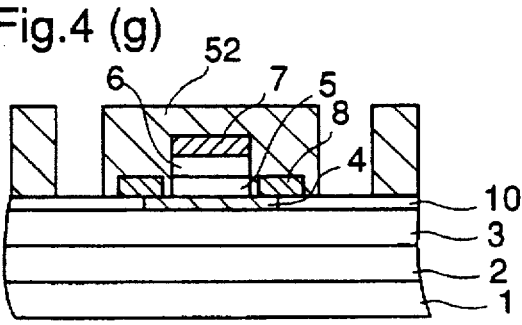
Figure 4:
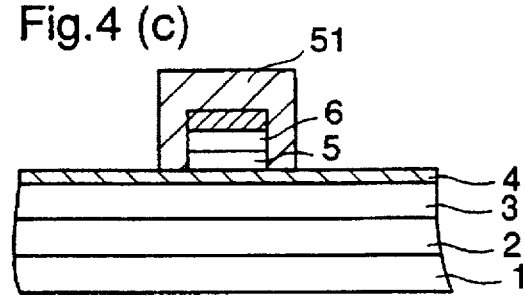
Figure 4:
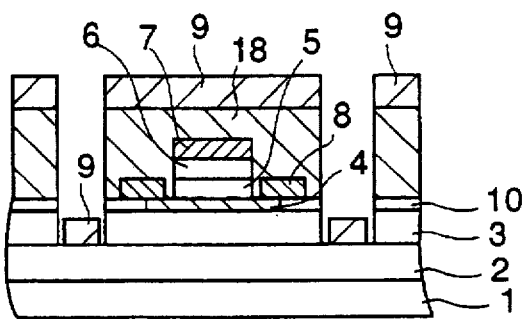
Figure 4:
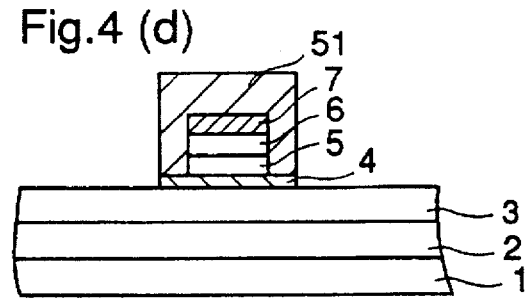
Figure 4:
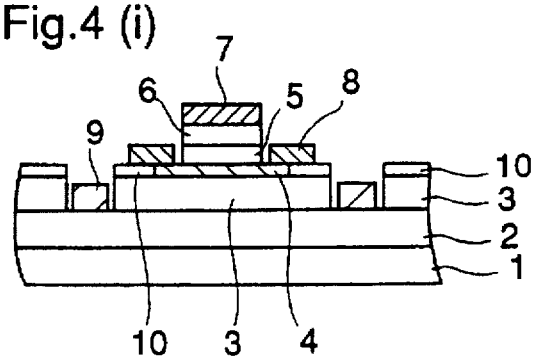
Figure 4:
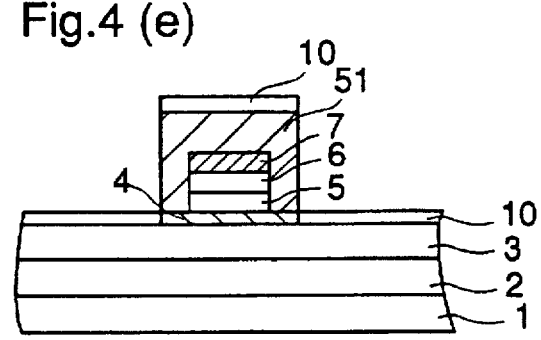

Initially, a collector contact layer 2, a collector layer 3, a base layer 4, an emitter layer 5, and an emitter contact layer 6 are successively epitaxially grown on a semi-insulating compound semiconductor substrate 1 (FIG. 4(a)). Preferably, compositions, concentrations, and thicknesses of the above-described layers are set as shown in the table 1.

TABLE 1

| layer | material | composition | concentration | thickness |
|---|---|---|---|---|
| emitter | n$^+$-In$_{0.5}$Ga$_{0.5}$As | y: 0 → 0.5 | 2 × 10$^{19}$ | 500 |
| contact layer | n$^+$-In$_y$Ga$_{1-y}$As | | 2 × 10$^{19}$ | 500 |
| emitter layer | n-Al$_x$Ga$_{1-x}$As | x: 0.3 → 0 | | 300 |
| | n-Al$_{0.3}$Ga$_{0.7}$As | | 5 × 10$^{17}$ | 900 |
| | n-Al$_x$Ga$_{1-x}$As | x: 0 → 0.3 | | 300 |
| base layer | p$^+$-GaAs | | 4 × 10$^{19}$ | 1000 |
| collector layer | n-GaAs | | 5 × 10$^{16}$ | 5000 |
| collector contact layer | n$^+$-GaAs | | 5 × 10$^{18}$ | 5000 |

Then, an emitter electrode (WSi) 7 is formed on the emitter contact layer 6. Using the emitter electrode 7 as a mask, the emitter contact layer 6 and the emitter layer 5 are selectively etched and removed to expose the base layer 4 (FIG. 4(b)).

Thereafter, a resist pattern 51 is formed covering the emitter layer 5, the emitter contact layer 6, and the emitter electrode 7 (FIG. 4(c)). Using the resist pattern 51 as a mask, regions of the base layer 4 other than the intrinsic base region and the external base regions are etched and removed (FIG. 4(d)). Then, an insulating film 10, such as SiO$_2$, is deposited using a low temperature and anisotropic deposition method. Preferably, it is deposited by ECR-CVD under the conditions of a gas flow ratio of 20 sccm/40 sccm for SiH$_4$/O$_2$, pressure of 1 mTorr, and microwave power of 600 W (FIG. 4(e)). The resist pattern 51 and a portion of the insulating film 10 on the resist pattern 51 are removed by a lift-off technique, leaving the insulating film 10 on the surface of the collector layer except at the base region.

Thereafter, base electrodes (Ti/Mo/Au) 8 are formed on both sides of the emitter layer 5 by vapor deposition and lift-off (FIG. 4(f)).

In the step of FIG. 4(g), a resist pattern 52 for forming collector electrodes is formed. After etching the insulating film 10 where the resist pattern 52 is absent, the collector layer 3 below the etched insulating film 10 is etched to expose the collector contact layer 2. Then, using the resist pattern 52 again, collector electrodes (AuGe) 9 are formed by vapor deposition and lift-off (FIG. 4(h)). Thereafter, sintering of the collector electrodes is carried out to make an ohmic contact between the collector electrodes 9 and the collector contact layer 2 (FIG. 4(i)).

In the method of fabricating an HBT according to the fourth embodiment of the invention, an HBT that includes the insulating film 10 disposed below the base electrode 8, that reduces the base-collector capacitance $C_{BC}$ even when the width of the base electrode exceeds a prescribed width (1 μm) for reducing in the base electrode resistance, and that provides an improved high frequency gain, as described for the first embodiment, is easily fabricated.

Embodiment 5

FIGS. 5(a)–5(i) are sectional views illustrating process steps in a method of fabricating the HBT described as the second embodiment, according to a fifth embodiment of the present invention.

Initially, a collector contact layer 2, a collector layer 3, a base layer 4, an emitter layer 5, and an emitter contact layer 6 are successively epitaxially grown on a semi-insulating compound semiconductor substrate 1. Then, a laminated structure pattern comprising an emitter electrode (WSi) 7 and a first insulating film 11 is formed on the emitter contact layer 6 (FIG. 5(a)).

Using the pattern as a mask, the emitter contact layer 6 and the emitter layer 5 are selectively etched to expose the base layer 4 (FIG. 5(b)).

Then, a second insulating film 12a comprising the same material as the first insulating film is deposited over the entire surface of the wafer and subjected to an anisotropic etching, such as reactive ion etching, to form first side walls 12 comprising the insulating film (FIG. 5(c)).

A third insulating film 13a is deposited over the wafer and anisotropically etched, thereby forming second side walls 13, contacting the first side walls 12 (FIG. 5(d)). The third insulating film comprises a material which can be selectively etched with respect to the first insulating film 11 and the first side walls 12.

In the step of FIG. 5(e), a semi-insulating semiconductor layer 14 is selectively grown on the collector layer 3.

Thereafter, a fourth insulating film 15a comprising the same material as the third insulating film is deposited over the entire surface of the wafer, and a resist pattern 53 having an aperture is formed on the fourth insulating film. Through the aperture of the resist pattern 53, the fourth insulating film 15a and the second side walls 13 comprising the third insulating film are etched, leaving the first side walls 12 (FIG. 5(f)).

Subsequently, a regrown crystal layer 16 doped with a dopant impurity producing the same conductivity type as the base layer 4 is selectively grown on the exposed base layer (FIG. 5(g)).

In the step of FIG. 5(h), base electrodes 8 are formed, each contacting the fourth insulating film 15 and the regrown crystal layer 16.

Then, the fourth insulating film 15, the semi-insulating semiconductor layer 14, and the collector layer 3 in regions where collector electrodes are later formed are etched to expose the collector contact layer 2. After formation of the collector electrodes 9, sintering of the collector electrodes 9 is carried out (FIG. 5(i)).

In the method of fabricating an HBT according to the fifth embodiment of the invention, since the semi-insulating semiconductor layer 14 is located below each base electrode 8, the base-collector capacitance $C_{BC}$ is reduced due to this semi-insulating semiconductor layer 14. Further, since the regrown crystal layer 16 having low resistance and connecting the base layer 4 to the base electrode 8 is provided and the contact area of the base electrode with the regrown crystal layer can be made relatively large, the contact resistance between them is significantly reduced. Therefore, an HBT in which the base resistance and the base-collector capacitance are reduced and the high frequency gain is improved as described in the second embodiment of the invention is easily fabricated.

In addition, the base layer 4 and the regrown crystal layer 16 are self-aligned with the emitter layer 5, the emitter contact layer 6, and the emitter electrode 7, whereby uniformity and reproducibility of electrical characteristics of the HBT are improved, resulting in good yield.

Embodiment 6

FIGS. 6(a)–6(i) are sectional views illustrating process steps in a method of fabricating the HBT described as the third embodiment, according to a sixth embodiment of the present invention.

A description is given of the fabricating method.

Figure 6:
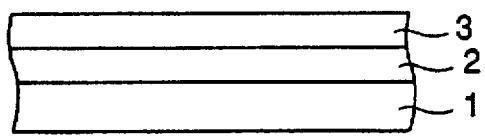
FIGS. 6(a)–6(i) are sectional views illustrating process steps in a method of fabricating the HBT shown in FIG. 3 in accordance with a sixth embodiment of the present invention.
Figure 6:
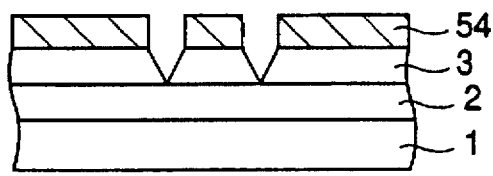
Figure 6:
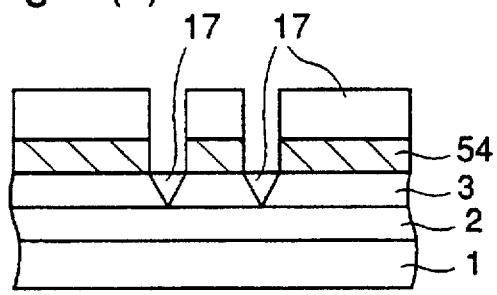
Figure 6:
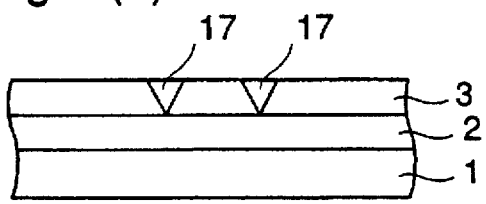
Figure 6:
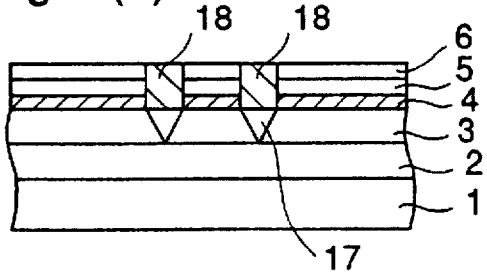
Figure 6:
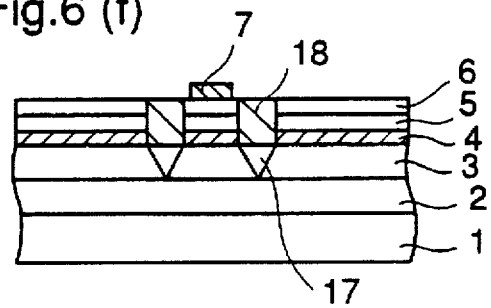
Figure 6:
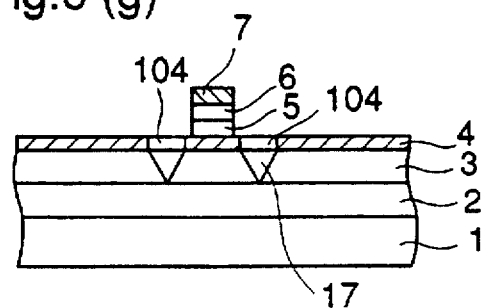
Figure 6:
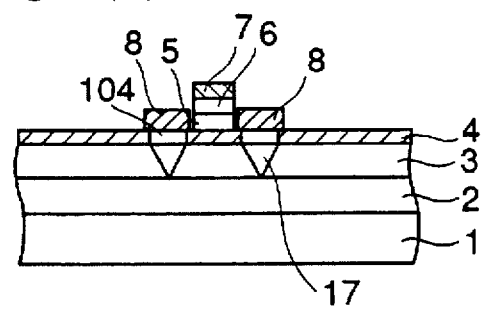
Figure 6:
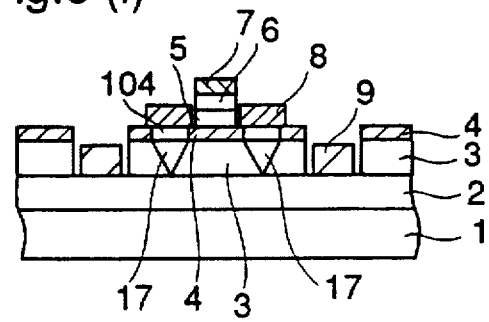
Figure 7:
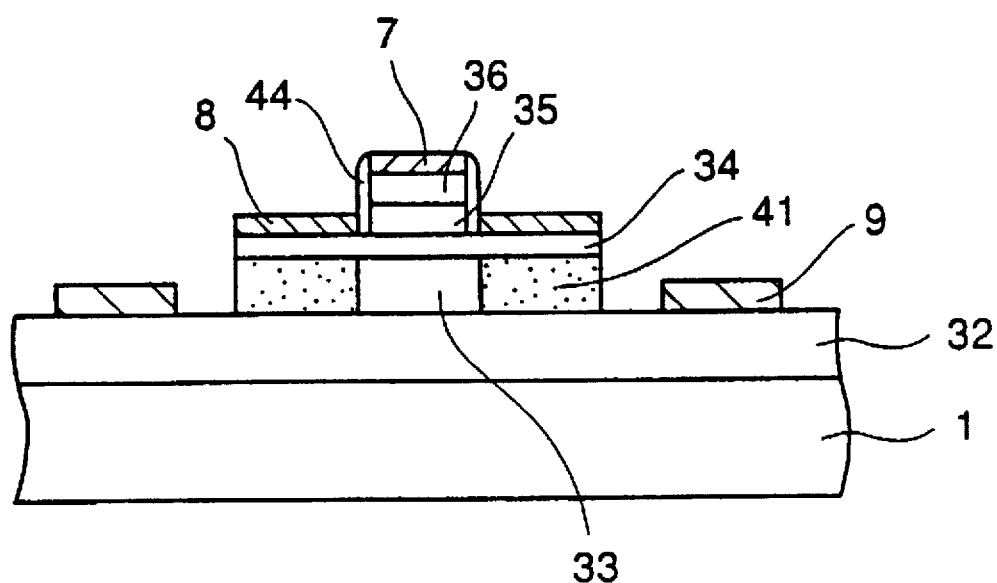
FIG. 7 is a sectional view of a prior art HBT disclosed in Japanese Published Patent Application No. Sho 62-22665.

Initially, a collector contact layer 2 and a collector layer 3 are successively grown on a semi-insulating compound semiconductor substrate 1 (FIG. 6(a)).

A resist pattern 54 is formed on the collector layer 3, and the collector layer 3 is selectively etched (FIG. 6(b)).

Then, an insulating film 17 is anisotropically deposited at a low temperature, preferably by ECR-CVD, (FIG. 6(c)), and embedded in the collector layer 3 by a lift-off technique (FIG. 6(d)).

Subsequently, a base layer 4, an emitter layer 5, and an emitter contact layer 6 are successively grown on the wafer (FIG. 6(e)). In this growth, a polycrystalline layer 18 is grown on the insulating film 17. In the step of FIG. 6(f), an emitter electrode 7 is formed on the emitter contact layer 6. Using the emitter electrode 7 as a mask, the emitter contact layer 6, the emitter layer 5, and the polycrystalline layer 18 are selectively etched, whereby the base layer 4 and the polycrystalline external base layer 104 are exposed (FIG. 6(g)).

In the step of FIG. 6(h), base electrodes 8 are formed on the polycrystalline external base layer 104.

Then, the base layer and the collector layer in regions where collector electrodes are later formed are selectively etched to expose the collector contact layer 2. After collector electrodes (AuGe) 9 are formed by vapor deposition and lift-off, sintering of the collector electrodes 9 is carried out (figure (i)).

In the method of fabricating an HBT according to the sixth embodiment of the invention, the insulating film 17 is embedded in a region of the collector layer 3, that is formed by etching surrounding the internal base region. The polycrystalline base layer 104 is located on the insulating film 17, and the base electrode 8 makes an ohmic contact with the base layer 4 through the polycrystalline base layer 104. In addition, a portion of the collector layer 3 comprising a material having relatively large dielectric constant, such as GaAs (dielectric constant: 13.2), is removed and an insulating film having a relatively small dielectric constant, such as SiO or SiN (dielectric constant: 5~6), fills the removed portion. Therefore, the base-collector capacitance is reduced and the high frequency gain is improved. Consequently, an HBT in which, even when the width of the base electrode exceeds a prescribed width for reducing the base electrode resistance, the base-collector capacitance $C_{BC}$ is reduced and the high frequency gain is improved is easily fabricated.

What is claimed is:

1. A heterojunction bipolar transistor including:

a compound semiconductor substrate;

a collector layer disposed on part of the compound semiconductor substrate;

a base layer disposed on part of the collector layer, the base layer comprising a semiconductor having a band gap energy, an area, an internal base region and an external base region having respective areas, and a conductivity type;

an emitter layer disposed on the base layer, having an area, and comprising a semiconductor having a band gap energy larger than the band gap energy of the semiconductor of the base layer wherein the base layer has an area larger than the area of the emitter layer by the area of the external base region;

semi-insulating semiconductor layers disposed outside the external base region on part of the collector layer sandwiching the base layer;

doped crystalline layers comprising a semiconductor having the same conductivity type as the external base region and disposed on the external base regions and on the adjacent semi-insulating semiconductor layers; and base electrodes making an ohmic contact with the base layer through the doped crystalline layers, the base electrodes being disposed on the doped crystalline layers.

* * * * *